(12) United States Patent  
Moon et al.

(10) Patent No.: US 7,919,871 B2  
(45) Date of Patent: Apr. 5, 2011

(54) INTEGRATED CIRCUIT PACKAGE SYSTEM FOR STACKABLE DEVICES

(75) Inventors: DongSoo Moon, Ichon-si (KR); Sungmin Song, Inchon (KR)

(73) Assignee: Stats Chippac Ltd., Singapore (SG)

( * ) Notice: Subject to any disclaimer, the term of this patent is extended or adjusted under 35 U.S.C. 154(b) by 228 days.

(21) Appl. No.: 12/052,910

(22) Filed: Mar. 21, 2008

(65) Prior Publication Data

US 2009/0236753 A1 Sep. 24, 2009

(51) Int. Cl.  
*H01L 23/48* (2006.01)

(52) U.S. Cl. . 257/777; 257/686; 257/778; 257/E23.172; 257/E23.178; 438/107; 438/108; 438/110

(58) Field of Classification Search .................. 257/777, 257/686, 778, E23.172, E23.178; 438/107, 438/108, 110  
See application file for complete search history.

(56) References Cited

U.S. PATENT DOCUMENTS

| | | | |
|---|---|---|---|
| 6,075,710 A | 6/2000 | Lau | |
| 6,153,928 A | 11/2000 | Cho | |
| 6,369,448 B1 | 4/2002 | McCormick | |
| 6,407,448 B2 | 6/2002 | Chun | |
| 6,555,917 B1 | 4/2003 | Heo | |
| 6,638,792 B2 | 10/2003 | Hui et al. | |
| 6,768,190 B2 | 7/2004 | Yang et al. | |
| 6,798,057 B2 | 9/2004 | Bolkin et al. | |
| 6,815,254 B2 | 11/2004 | Mistry et al. | |
| 6,828,665 B2 | 12/2004 | Pu et al. | |
| 6,861,761 B2 | 3/2005 | Yang et al. | |
| 6,906,416 B2 | 6/2005 | Karnezos | |
| 7,026,709 B2 | 4/2006 | Tsai et al. | |
| 7,217,994 B2 | 5/2007 | Zhu et al. | |
| 7,247,933 B2 | 7/2007 | Juskey et al. | |
| 7,279,783 B1 | 10/2007 | Fjelstad et al. | |
| 7,288,835 B2 | 10/2007 | Yim et al. | |
| 7,298,033 B2 | 11/2007 | Yoo | |
| 7,355,274 B2 | 4/2008 | Lim | |
| 7,391,105 B2 | 6/2008 | Yeom | |
| 7,420,814 B2 | 9/2008 | Kim et al. | |
| 7,557,443 B2 | 7/2009 | Ye et al. | |
| 7,589,408 B2 | 9/2009 | Weng et al. | |
| 7,608,921 B2 | 10/2009 | Pendse | |
| 2005/0133932 A1 | 6/2005 | Pohl et al. | |
| 2006/0220211 A1* | 10/2006 | Yamazaki et al. | 257/686 |
| 2006/0220256 A1 | 10/2006 | Shim et al. | |
| 2006/0244157 A1 | 11/2006 | Carson | |
| 2007/0181989 A1* | 8/2007 | Corisis et al. | 257/686 |
| 2007/0216010 A1 | 9/2007 | Yim et al. | |
| 2007/0229107 A1 | 10/2007 | Kim et al. | |
| 2007/0246815 A1 | 10/2007 | Lu et al. | |
| 2008/0029867 A1 | 2/2008 | Kim et al. | |
| 2008/0029868 A1 | 2/2008 | Lee et al. | |
| 2008/0042251 A1 | 2/2008 | Weng et al. | |
| 2009/0152740 A1 | 6/2009 | Park et al. | |
| 2009/0166835 A1 | 7/2009 | Yang et al. | |

FOREIGN PATENT DOCUMENTS

WO 2007024483 A2 3/2007

* cited by examiner

*Primary Examiner* — Tu-Tu V Ho  
(74) *Attorney, Agent, or Firm* — Mikio Ishimaru

(57) ABSTRACT

An integrated circuit package system includes: providing a lower interposer substrate with lower exposed conductors; attaching a die over the lower interposer substrate; applying a stack encapsulant over the die and the lower interposer substrate having the lower exposed conductors partially exposed adjacent the stack encapsulant; and attaching an upper interposer substrate having upper exposed conductors over the stack encapsulant and with the upper exposed conductors substantially exposed.

12 Claims, 5 Drawing Sheets

INTEGRATED CIRCUIT PACKAGE SYSTEM FOR STACKABLE DEVICES

CROSS-REFERENCE TO RELATED APPLICATION(S)

The present application contains subject matter related to co-pending U.S. patent application Ser. No. 11/966,219 filed Dec. 28, 2007.

The present application also contains subject matter related to co-pending U.S. patent application Ser. No. 11/957,862 filed Dec. 17, 2007.

The related applications are assigned to STATS ChipPAC Ltd.

TECHNICAL FIELD

The present invention relates generally to integrated circuit packages and more particularly to integrated circuit package systems with stackable devices.

BACKGROUND ART

The integrated circuit package is the building block used in a high performance electronic system to provide applications for usage in products such as smart phones, pocket personal computers, intelligent portable military devices, aeronautical spacecraft payloads, and a vast line of other similar products that require small compact electronics supporting many complex functions.

The integrated circuit, such as a chip or die, contains circuitry that is designed to perform various functions in the high performance electronic system. Products having small dimensional requirements and many complex functions rely on limited size, limited quantity, and high input output (IO) connectivity integrated circuit packages.

The integrated circuit package can consists of a package base or package substrate providing a mounting structure on which at least one chip or die is attached and an enclosure such as an epoxy applied on it to protect its contents.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, or can be externally connected onto the single sealed package structure. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. Also, the leverage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention includes: providing a lower interposer substrate with lower exposed conductors; a die over the lower interposer substrate; a stack encapsulant over the die and the lower interposer substrate having the lower exposed conductors partially exposed adjacent the stack encapsulant; and attaching an upper interposer substrate having upper exposed conductors over the stack encapsulant and with the upper exposed conductors partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
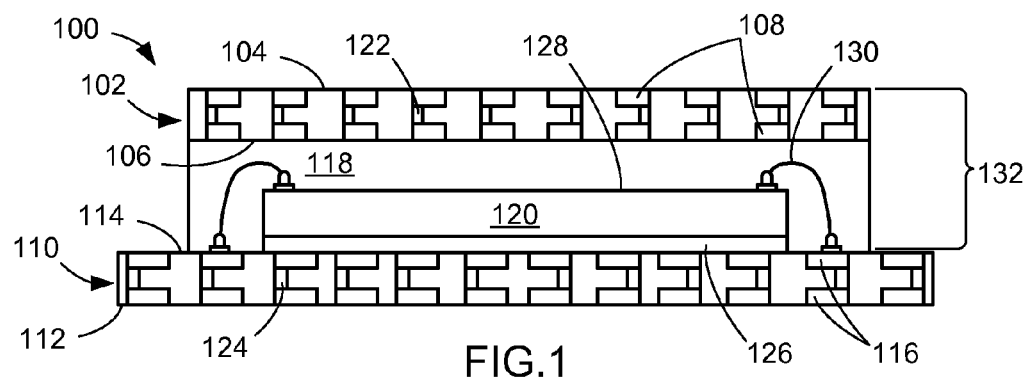
FIG. 1 is a cross-sectional view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a cross-sectional view of an integrated circuit package system 100 in a first embodiment of the present invention. The integrated circuit package system 100 preferably includes an upper interposer substrate 102, an upper outward surface 104, an upper inward surface 106, and upper exposed conductors 108.

The integrated circuit package system 100 also preferably includes a lower interposer substrate 110 having a length or width greater than the corresponding length or width of the upper interposer substrate 102, a lower outward surface 112, a lower inward surface 114, lower exposed conductors 116, a stack encapsulant 118, and a die 120.

The upper interposer substrate 102 includes an upper conductive material 122. The upper exposed conductors 108 connect to the upper conductive material 122 and are distributed near the upper outward surface 104 and the upper inward surface 106 of the upper interposer substrate 102.

Each of the upper exposed conductors 108 can be fabricated such that its exposed surface provides sufficient surface area for connective attachments such as wires, solder balls, leads, or any other user specific connection technology.

The lower interposer substrate 110 includes a lower conductive material 124. The lower exposed conductors 116 connect to the lower conductive material 124 and are distributed near the lower outward surface 112 and the lower inward surface 114 of the lower interposer substrate 110.

Each of the lower exposed conductors 116 can be fabricated such that its exposed surface provides sufficient surface area for connective attachments such as wires, solder balls, leads, or any other user specific connection technology.

The die 120 is mounted over the lower interposer substrate 110 using an attachment layer 126 attached to a surface opposite a die active surface 128 and the lower inward surface 114. Stack connectors 130 can connect to areas of the die active surface 128 and the lower exposed conductors 116 near the lower inward surface 114 to provide circuit connectivity with the lower interposer substrate 110.

The stack encapsulant 118 can be applied over the die 120, the stack connectors 130, and the lower exposed conductors 116 having direct connections to the stack connectors 130. Any of the lower exposed conductors 116 not directly connected to any of the stack connectors 130 can remain exposed and free of the stack encapsulant 118 to provide attachable access areas to the lower interposer substrate 110 and thereby circuitry of the die 120.

The upper inward surface 106 of the upper interposer substrate 102 can be mounted on the stack encapsulant 118. The upper interposer substrate 102, the stack encapsulant 118, the die 120, the attachment layer 126, and the stack connectors 130 can be referred to as a stack body assembly 132 of the integrated circuit package system 100.

The integrated circuit package system 100 can optionally be tested or processed before it is finally incorporated into a next level of user assembly such as a package, a printed circuit board, mixed process technology assembly, or similar integration level.

Any of the upper exposed conductors 108 and any of the lower exposed conductors 116 could provide connectivity to the integrated circuit package system 100. It is understood that the circuitry and associated connections included between the upper interposer substrate 102 and the lower interposer substrate 110 could optionally consists of multiple dice, multiple packages, or any similar combinational forms of integrated circuitry.

The lower interposer substrate 110 and the upper interposer substrate 102 can be of any length, width, or thickness and as such could provide package connectivity to the lower outward surface 112, the lower inward surface 114, the upper inward surface 106, or the upper outward surface 104. The integrated circuit package system 100 provides substantial improvements in connectivity, signal routing, and functional scalability for electronic products.

It has been unexpectedly discovered that the integrated circuit package system 100 having the lower interposer substrate 110 having a length or width greater than the corresponding length or width of the upper interposer substrate 102 can be included in a stacked structure to produce a small body footprint package structure having a significant amount of circuitry.

Figure 2:
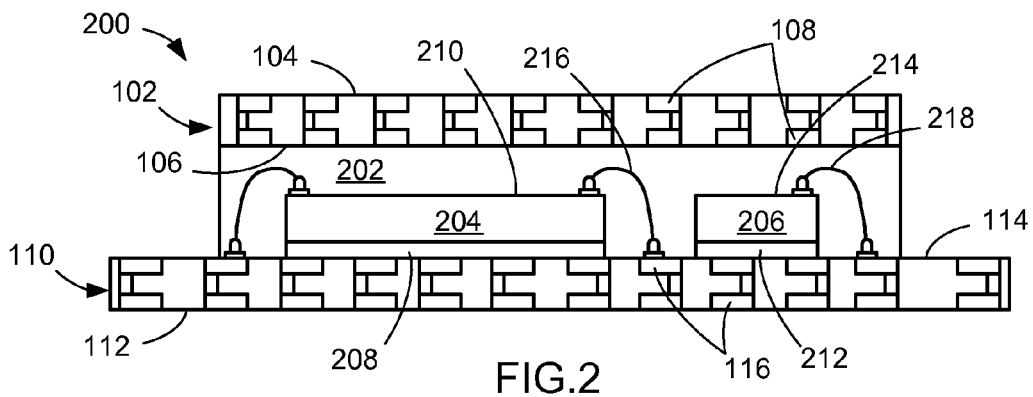
FIG. 2 is a cross-sectional view of an integrated circuit package system in a second embodiment of the present invention.

Referring now to FIG. 2, therein is shown a cross-sectional view of an integrated circuit package system 200 in a second embodiment of the present invention. The integrated circuit package system 200 preferably includes the upper interposer substrate 102, the lower interposer substrate 110, a stack encapsulant 202, a first die 204, and a second die 206.

The first die 204 is mounted over the lower interposer substrate 110 using a first attachment layer 208 attached to a surface opposite a first die active surface 210 and the lower inward surface 114. The second die 206 is mounted adjacent the first die 204 and over the lower interposer substrate 110 using a second attachment layer 212 attached to a surface opposite a second die active surface 214 and the lower inward surface 114.

First stack connectors 216 can connect to areas of the first die active surface 210 and the lower exposed conductors 116 near the lower inward surface 114 to provide circuit connectivity of the first die 204 with the lower interposer substrate 110. Second stack connectors 218 can connect to areas of the second die active surface 214 and the lower exposed conductors 116 near the lower inward surface 114 to provide circuit connectivity of the second die 206 with the lower interposer substrate 110.

The stack encapsulant 202 can be applied over the first die 204, the second die 206, the first stack connectors 216, the second stack connectors 218, and the lower exposed conductors 116 having direct connections to either the first stack connectors 216 or the second stack connectors 218.

The lower exposed conductors 116 not directly attached to the first stack connectors 216 or the second stack connectors 218 can remain exposed and free of the stack encapsulant 202. Any of the lower exposed conductors 116 not covered with the stack encapsulant 202 can provide connectivity to circuitry of the integrated circuit package system 200.

The upper inward surface 106 of the upper interposer substrate 102 can be mounted on the stack encapsulant 202. The upper outward surface 104 of the upper interposer substrate 102 can be provide connectivity from any one of the upper exposed conductors 108 to another one or more of the upper exposed conductors 108 near the upper outward surface 104.

The integrated circuit package system 200 can optionally be tested or processed before it is incorporated into a next level of user assembly.

Figure 3:
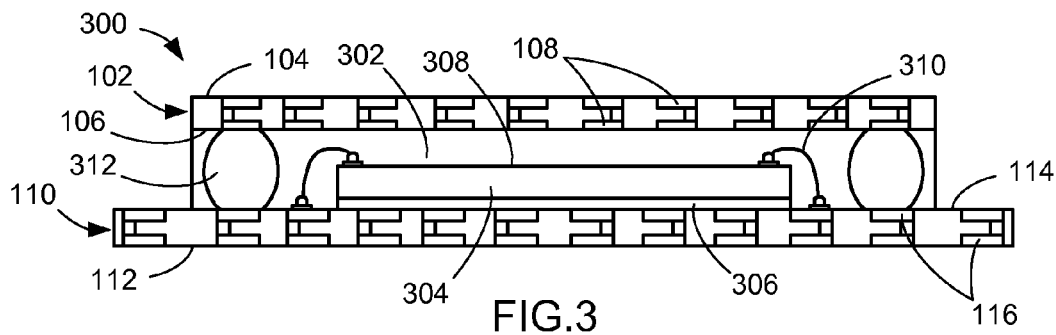
FIG. 3 is a cross-sectional view of an integrated circuit package system in a third embodiment of the present invention.

Referring now to FIG. 3, therein is shown a cross-sectional view of an integrated circuit package system 300 in a third embodiment of the present invention. The integrated circuit package system 300 preferably includes the upper interposer substrate 102, the lower interposer substrate 110, a stack encapsulant 302, and a die 304.

An attachment layer 306 attaching to a surface opposite an active surface 308 of the die 304 is attached to the lower inward surface 114 of the lower interposer substrate 110. Stack connectors 310, adjacent the die 304, can connect to areas of the active surface 308 and the lower exposed conductors 116 near the lower inward surface 114 to provide circuit connectivity with the lower interposer substrate 110.

The upper interposer substrate 102 can be connected to the lower interposer substrate 110 using interposer connectors 312 adjacent the stack connectors 310 to attach the upper exposed conductors 108 to the lower exposed conductors 116 near the lower inward surface 114.

The stack encapsulant 302 can be applied between the upper inward surface 106 and the lower inward surface 114 surrounding the stack connectors 310 and the interposer connectors 312. The lower exposed conductors 116 or the upper exposed conductors 108, exposed and free of the stack encapsulant 302, can provide connectivity within or between circuitry of the integrated circuit package system 300.

The lower exposed conductors 116 can further provide connectivity between circuitries connecting to the lower interposer substrate 110 and the upper exposed conductors 108 can further provide connectivity between circuitries connecting to the upper interposer substrate 102.

Figure 4:
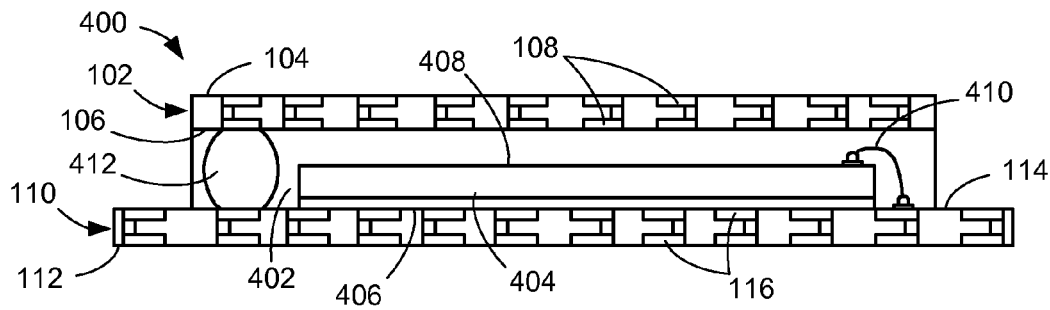
FIG. 4 is a cross-sectional view of an integrated circuit package system in a fourth embodiment of the present invention.

Referring now to FIG. 4, therein is shown a cross-sectional view of an integrated circuit package system 400 in a fourth embodiment of the present invention. The integrated circuit package system 400 preferably includes the upper interposer substrate 102, the lower interposer substrate 110, a stack encapsulant 402, and a die 404. An attachment layer 406 attaching to a surface opposite an active surface 408 of the die 404 is attached to the lower inward surface 114 of the lower interposer substrate 110.

Stack connectors 410 can connect areas of the active surface 408 along at least one edge of the die 404 to the lower exposed conductors 116 near the lower inward surface 114 to provide circuit connectivity with the lower interposer substrate 110.

The upper interposer substrate 102 can be mounted over the lower interposer substrate 110 using interposer connectors 412 adjacent at least one edge opposite the edge of the die 404 having at least one of the stack connectors 410. The interposer connectors 412 connect the upper exposed conductors 108 near the upper inward surface 106 to the lower exposed conductors 116 near the lower inward surface 114.

The stack encapsulant 402 can be applied between the upper inward surface 106 and the lower inward surface 114 and adjacent the stack connectors 410 and the interposer connectors 412. The lower exposed conductors 116 not attached to the stack connectors 410 or the interposer connectors 412 can be free of the stack encapsulant 402.

Any of the lower exposed conductors 116 or the upper exposed conductors 108 that are exposed and free of the stack encapsulant 402 can provide connectivity within or between circuitry of the integrated circuit package system 400, circuitry connecting to the lower interposer substrate 110, or circuitry connecting to the upper interposer substrate 102.

Figure 5:
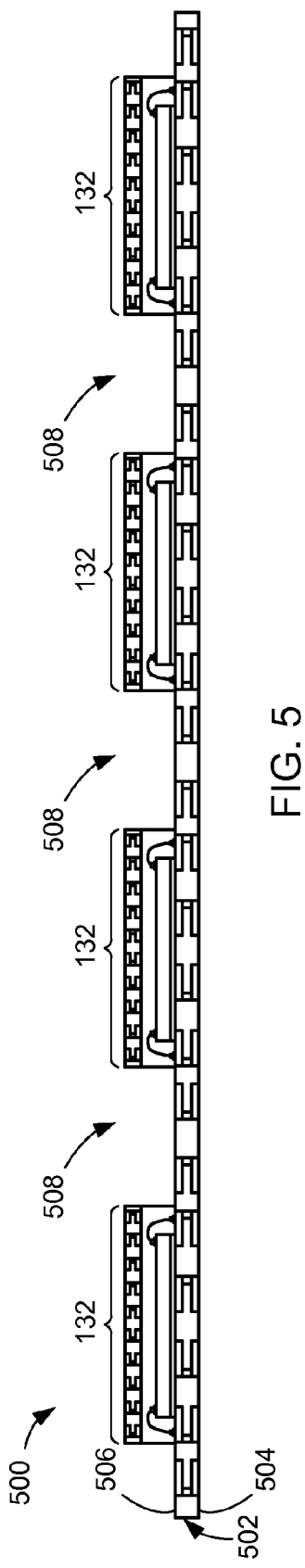
FIG. 5 is a cross-sectional view of an integrated circuit package system in a fifth embodiment of the present invention.

Referring now to FIG. 5, therein is shown a cross-sectional view of an integrated circuit package system 500 in a fifth embodiment of the present invention. The integrated circuit package system 500 preferably includes a lower interposer substrate board 502, a lower outward surface 504, a lower inward surface 506, separation zones 508, and multiple structures of the stack body assembly 132.

The lower interposer substrate board 502 consists of the lower outward surface 504 and the lower inward surface 506, having sufficient dimensions to provide for mounting and assembling of multiple structures of the stack body assembly 132, and having interspersed pre-defined fabrication areas know as the separation zones 508. The integrated circuit package system 500, as shown in its entirety in FIG. 5, can be referred to as a strip assembly.

The integrated circuit package system 500 is subjected to a testing process whereby circuitry of the stack body assembly 132 can be extensively tested and verified. This screening process identifies the stack body assembly 132 having known good die (KGD) and conversely the stack body assembly 132 with defects.

The separation zones 508 are predefined areas located on the lower interposer substrate board 502 for purposes of electrically and physically separating the stack body assembly 132 and its associated portion of the lower interposer substrate board 502 from another.

Figure 6:
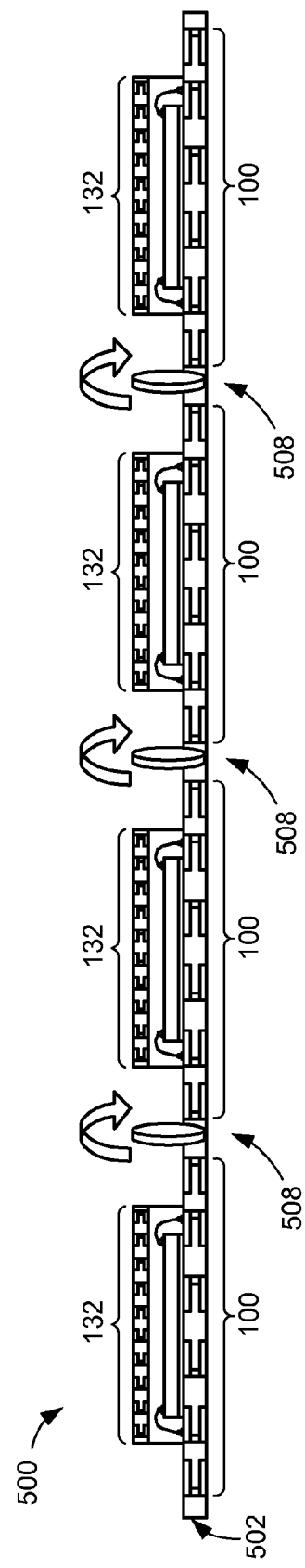
FIG. 6 is the structure of FIG. 5 in a singulation phase.

Referring now to FIG. 6, therein is shown the structure of FIG. 5 in a singulation phase. The lower interposer substrate board 502 is singulated at the separation zones 508 using a separation process. After singulation, components consisting of the stack body assembly 132 of FIG. 1 and associated portions of the lower interposer substrate board 502, have been transformed into one of many replications of the integrated circuit package system 100 and can be further processed as either KGD or defective units.

Figure 7:
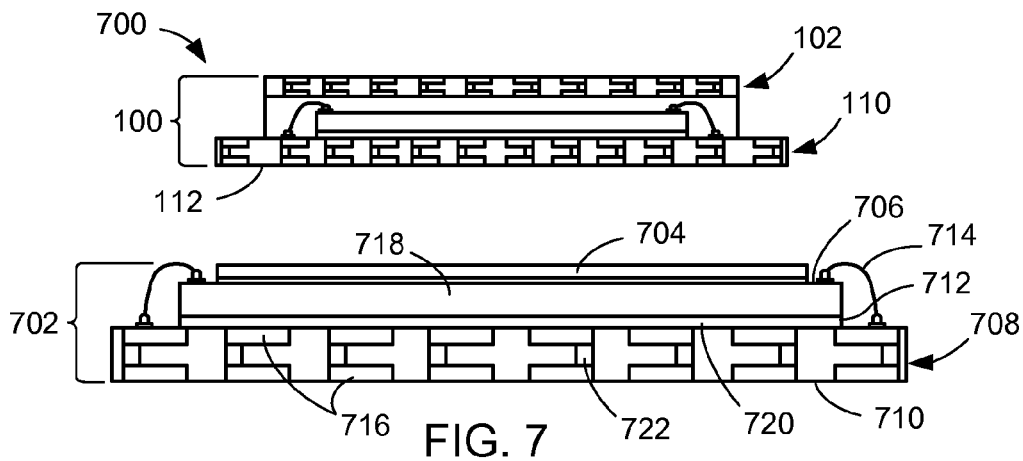
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes the integrated circuit package system 100 mounted above a base assembly 702 using a stack attachment layer 704. The stack attachment layer 704 is attached to a base die active surface 706 and the lower outward surface 112.

The base assembly 702 can preferably include a base substrate 708, a base system surface 710, a base component surface 712, base assembly interconnects 714, base surface pads 716, a base die 718 having a length or width smaller than the corresponding length or width of the base substrate 708, a base attachment layer 720, and base conductors 722.

The base substrate 708 includes the base surface pads 716 that are exposed and near the base system surface 710 and the base component surface 712. The base surface pads 716 can connect to the base conductors 722 to provide connectivity within or between the base system surface 710 and the base component surface 712.

The base die active surface 706 not covered by the stack attachment layer 704 can be used to provide connectivity to circuitry of the base die 718. The base die 718 can be mounted above the base substrate 708 using the base attachment layer 720 attached to the side opposite the base die active surface 706 and the base component surface 712. The base assembly interconnects 714 can provide connectivity between the base die active surface 706 and the base surface pads 716 exposed near the base component surface 712.

The integrated circuit package system 700 can provide connectivity within or between circuitry attached to the base system surface 710, circuitry attached to the base component surface 712, circuitry attached to the lower interposer substrate 110, or circuitry attached to the upper interposer substrate 102.

The integrated circuit package system 700 can be further incorporated into a next level system. It is noted that the base assembly 702 could optionally consists of multiple dice, multiple packages, or any similar combinational forms of integrated circuitry to provide a substantial increase in functionality with little loss in connectivity or increase in footprint.

Figure 8:
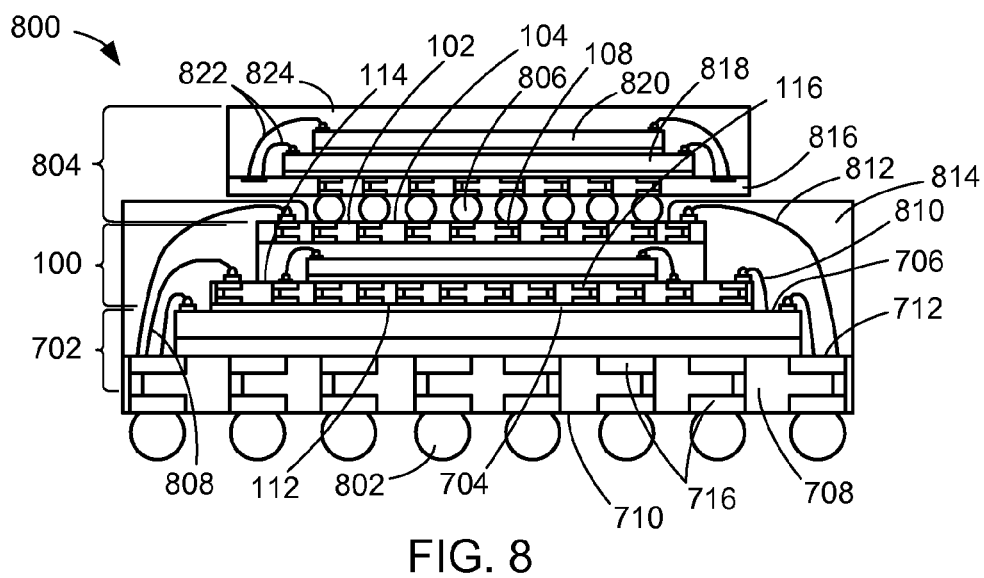
FIG. 8 is a cross-sectional view of an integrated circuit package system in a seventh embodiment of the present invention.

Referring now to FIG. 8, therein is shown a cross-sectional view of an integrated circuit package system 800 in a seventh embodiment of the present invention. The integrated circuit package system 800 preferably includes the integrated circuit package system 100 mounted on the stack attachment layer 704 of the base assembly 702, base connectors 802 attached to the base surface pads 716 exposed near the base system surface 710 of the base assembly 702, a device 804, and integrated circuit package connectors 806.

First connectors 808 can provide connectivity between the lower exposed conductors 116 near the lower inward surface 114 and the base surface pads 716 exposed near the base component surface 712. Second connectors 810 can provide connectivity between the lower exposed conductors 116 near the lower inward surface 114 and the base die active surface 706.

Third connectors 812 can provide connectivity between the upper exposed conductors 108 near the upper outward surface 104 and the base surface pads 716 exposed near the base component surface 712. An encapsulant 814 covers the base component surface 712, the first connectors 808, the second connectors 810, the third connectors 812, and the integrated circuit package system 100 except areas of the upper outward surface 104 not having attachment to the third connectors 812.

The device 804 consists of a device substrate 816, a first device die 818, a second device die 820, and device connectors 822.

The first device die 818 is mounted over the device substrate 816 and the second device die 820 is mounted over the first device die 818. The device substrate 816 is connected to the circuitry of the first device die 818 and the second device die 820 using the device connectors 822.

A device encapsulant 824 covers the device connectors 822, the first device die 818, the second device die 820, and surface of the device substrate 816 and located below the dice. The integrated circuit package connectors 806 of the device 804 can connect to the upper exposed conductors 108 near the upper outward surface 104 of the upper interposer substrate 102. The base connectors 802 can provide connectivity between a next level system such as a printed circuit board and the integrated circuit package system 800.

It is noted that the device 804 is not limited to a multiple chip or a ball grid array package and for example could be replaced with a package on package, stacked package, flip chip package, or any device having a compatible attachment technology with the form factor and specific characteristics designed into the upper exposed conductors 108.

Figure 9:
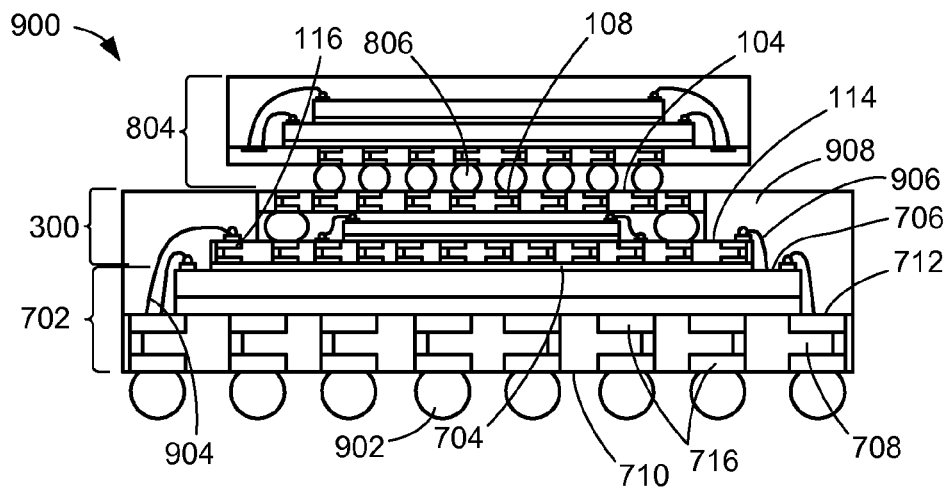
FIG. 9 is a cross-sectional view of an integrated circuit package system in an eighth embodiment of the present invention.

Referring now to FIG. 9, therein is shown a cross-sectional view of an integrated circuit package system 900 in an eighth embodiment of the present invention. The integrated circuit package system 900 preferably includes the integrated circuit package system 300 mounted on the stack attachment layer 704 of the base assembly 702, base connectors 902 attached to the base surface pads 716 exposed near the base system surface 710 of the base assembly 702, the device 804, and the integrated circuit package connectors 806.

First connectors 904 can provide connectivity between the lower exposed conductors 116 adjacent the lower inward surface 114 and the base surface pads 716 exposed near the base component surface 712. Second connectors 906 can provide connectivity between the lower exposed conductors 116 near the lower inward surface 114 and the base die active surface 706. An encapsulant 908 covers the base component surface 712, the first connectors 904, the second connectors 906, and the integrated circuit package system 300 except the upper exposed conductors 108 near the upper outward surface 104.

The integrated circuit package connectors 806 of the device 804 can be connected to the upper exposed conductors 108 near the upper outward surface 104. The base connectors 902 can provide connectivity between a next level system such as another integrated circuit package and the integrated circuit package system 900.

Figure 10:
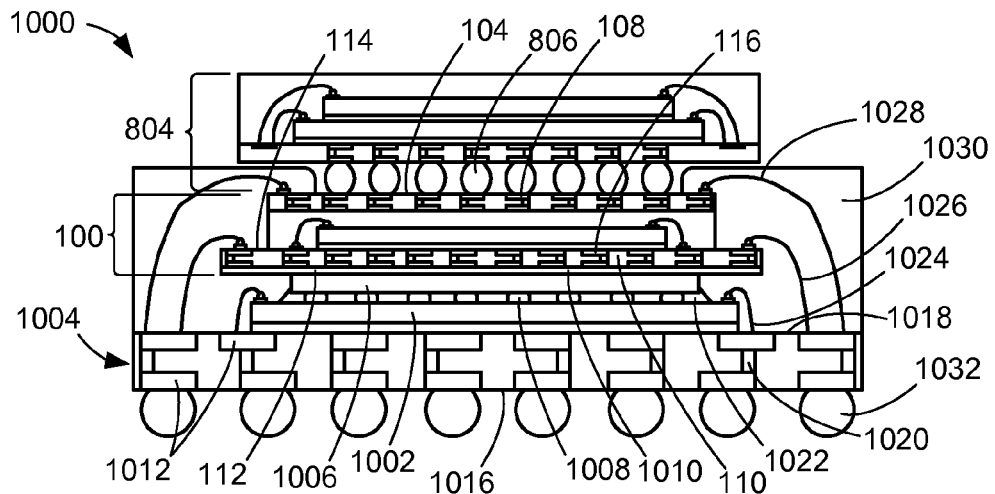
FIG. 10 is a cross-sectional view of an integrated circuit package system in a ninth embodiment of the present invention.

Referring now to FIG. 10, therein is shown a cross-sectional view of an integrated circuit package system 1000 in a ninth embodiment of the present invention. The integrated circuit package system 1000 preferably includes a first base die 1002, a base substrate 1004, a second base die 1006, and the device 804.

The first base die 1002 is mounted over the base substrate 1004. The second base die 1006 is mounted above the first base die 1002 having connectivity to the first base die 1002 using base die conductors 1008. The integrated circuit package system 100 is mounted above the second base die 1006 using a stack attachment layer 1010 attaching the lower interposer substrate 110 to the second base die 1006.

Package pads 1012, consisting of attachable conductive surfaces, are exposed near a package system surface 1016 and a package component surface 1018 of the base substrate 1004. Any one of the package pads 1012 can have connectivity to another one or more of the package pads 1012 using substrate conductors 1020 located on and within the base substrate 1004.

A base die underfill 1022 can be applied between the first base die 1002 and the second base die 1006 to provide protection to the base die conductors 1008. First connectors 1024 connecting the first base die 1002 to the package pads 1012 of the base substrate 1004 can provide access to circuitry of the first base die 1002 and the second base die 1006 to the base substrate 1004.

Second connectors 1026 connecting the lower exposed conductors 116 near the lower inward surface 114 to the package pads 1012 of the base substrate 1004 can provide access to circuitry of the integrated circuit package system 100 to the base substrate 1004. Third connectors 1028 can connect the upper exposed conductors 108 near and adjacent the outer perimeter of the upper outward surface 104 to the base substrate 1004 to provide access to circuitry connecting to the upper outward surface 104.

A package encapsulant 1030 can be applied over the integrated circuit package system 100, the first connectors 1024, the second connectors 1026, and the third connectors 1028, excluding the upper exposed conductors 108 not attached to the third connectors 1028 near the upper outward surface 104. The integrated circuit package connectors 806 of the device 804 can be connected to the upper exposed conductors 108 near the upper outward surface 104.

The integrated circuit package system 1000 can provide access to circuitry of the device 804, circuitry of the integrated circuit package system 100, and any circuitry located below the integrated circuit package system 100 and above the base substrate 1004.

Attachment of system connectors 1032 to the package pads 1012 near the package system surface 1016 can provide connectivity of the integrated circuit package system 1000 to a next level system such as another package or printed circuit board.

Figure 11:
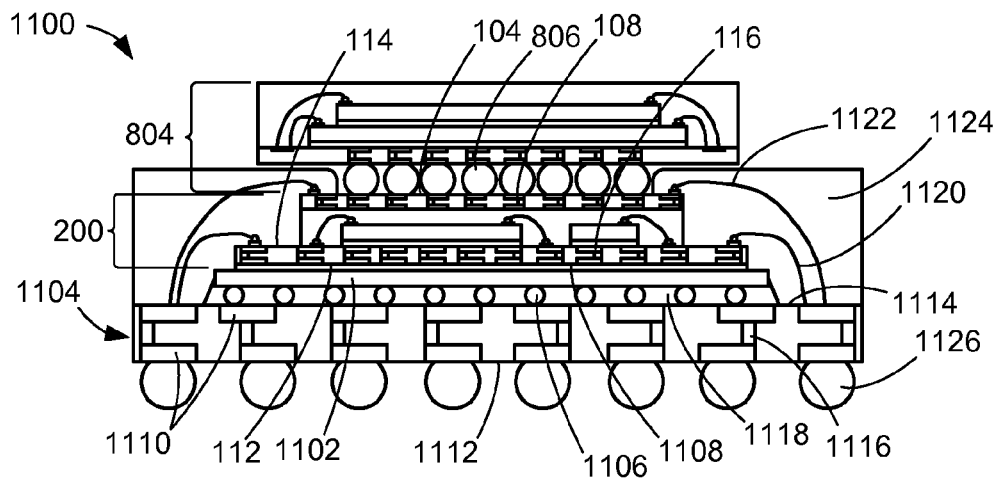
FIG. 11 is a cross-sectional view of an integrated circuit package system in a tenth embodiment of the present invention.

Referring now to FIG. 11, therein is shown a cross-sectional view of an integrated circuit package system 1100 in a tenth embodiment of the present invention. The integrated circuit package system 1100 preferably includes a base die 1102 mounted over a base substrate 1104 using base die conductors 1106 to provide connectivity to the base substrate 1104, the integrated circuit package system 200 mounted above the base die 1102 using a stack attachment layer 1108, and the device 804.

Package pads 1110, consisting of attachable conductive surfaces, are exposed near a package system surface 1112 and a package component surface 1114 of the base substrate 1104. Any one of the package pads 1110 can have connectivity to another one or more of the package pads 1110 using substrate conductors 1116 located on and within the base substrate 1104.

A base die underfill 1118 can be applied between the base die 1102 and the package component surface 1114 to provide protection to the base die conductors 1106. First connectors 1120 connecting the lower exposed conductors 116 near the lower inward surface 114 to the package pads 1110 of the base substrate 1104 can provide access to circuitry of the base die 1102 to the base substrate 1104.

Second connectors 1122 connecting the upper exposed conductors 108 near and adjacent the outer perimeter of the upper outward surface 104 to the base substrate 1104 can provide access to circuitry connecting to the upper outward surface 104. A package encapsulant 1124 can be applied over the integrated circuit package system 200, the first connectors 1120, and the second connectors 1122, excluding the upper exposed conductors 108 not attached to the second connectors 1122 near the upper outward surface 104.

The integrated circuit package connectors 806 of the device 804 can be connected to the upper exposed conductors 108 near the upper outward surface 104.

The integrated circuit package system 1100 can provide access to circuitry of the device 804, circuitry of the integrated circuit package system 200, and any circuitry located below the integrated circuit package system 200 and above the base substrate 1104.

Attachment of system connectors 1126 to the package pads 1110 near the package system surface 1112 can provide connectivity of the integrated circuit package system 1100 to a next level system such as another package or printed circuit board.

Figure 12:
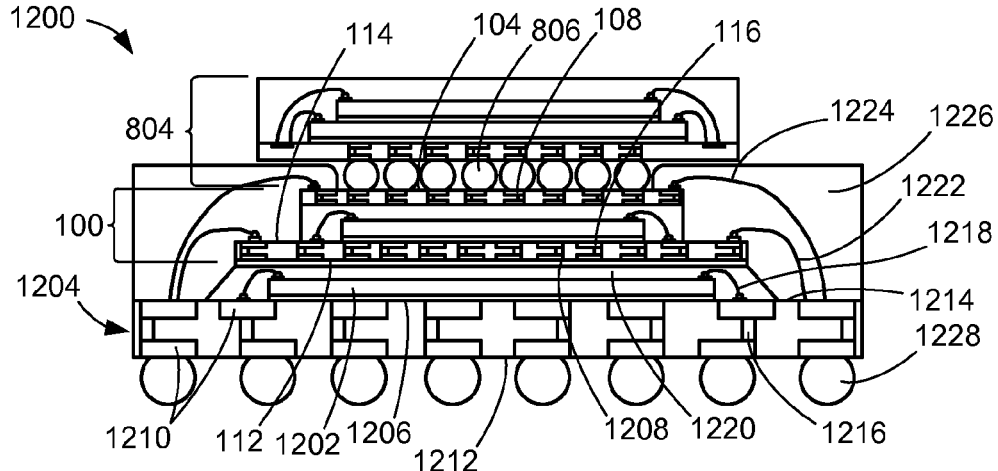
FIG. 12 is a cross-sectional view of an integrated circuit package system in an eleventh embodiment of the present invention.

Referring now to FIG. 12, therein is shown a cross-sectional view of an integrated circuit package system 1200 in an eleventh embodiment of the present invention. The integrated circuit package system 1200 preferably includes a base die 1202 mounted over a base substrate 1204 using an attachment layer 1206, the integrated circuit package system 100 mounted above the base die 1202 using a stack attachment layer 1208, and the device 804.

Package pads 1210, consisting of attachable conductive surfaces, are exposed near a package system surface 1212 and a package component surface 1214 of the base substrate 1204. Any one of the package pads 1210 can have connectivity to another one or more of the package pads 1210 using substrate conductors 1216 located on and within the base substrate 1204.

First connectors 1218 connecting the base die 1202 to the package pads 1210 of the base substrate 1204 can provide access to circuitry of the base die 1202. A base die encapsulant 1220 can be applied over the base die 1202 and the first connectors 1218. The integrated circuit package system 1200 is mounted over the base die 1202 using the stack attachment layer 1208 connecting the lower outward surface 112 to the base die encapsulant 1220.

Second connectors 1222 connecting the lower exposed conductors 116 near the lower inward surface 114 to the package pads 1210 of the base substrate 1204 can provide access to circuitry of the integrated circuit package system 100 to the base substrate 1204. Third connectors 1224 can connect the upper exposed conductors 108 near and adjacent the perimeter of the upper outward surface 104 to the base substrate 1204 to provide access to circuitry connecting to the upper outward surface 104.

A package encapsulant 1226 can be applied over the integrated circuit package system 100, the first connectors 1218, the second connectors 1222, and the third connectors 1224, excluding the upper exposed conductors 108 not attached to the third connectors 1224 near the upper outward surface 104. The integrated circuit package connectors 806 of the device 804 can be connected to the upper exposed conductors 108 near the upper outward surface 104.

The resulting integrated circuit package system 1200 can provide access to circuitry of the device 804, circuitry of the integrated circuit package system 100, and any circuitry located below the integrated circuit package system 100 and above the base substrate 1204.

Attachment of system connectors 1228 to the package pads 1210 near the package system surface 1212 can provide connectivity of the integrated circuit package system 1200 to a next level system such as another package or printed circuit board.

Figure 13:
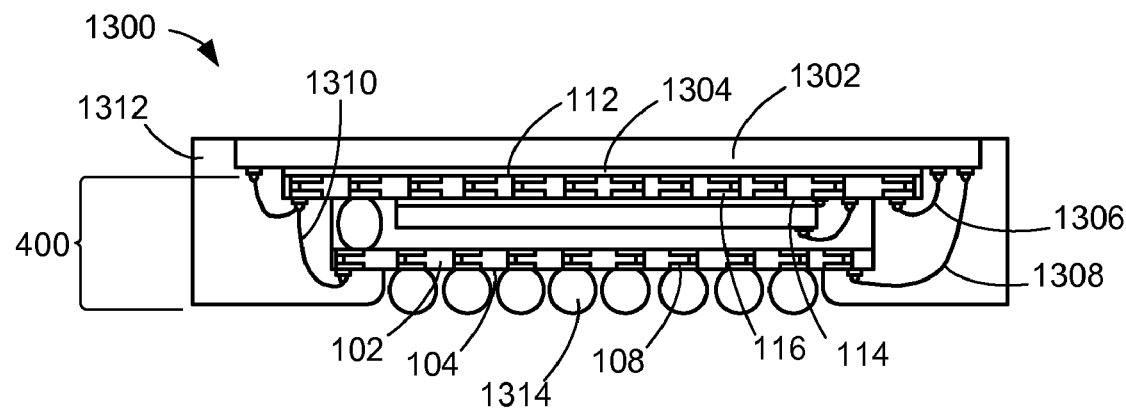
FIG. 13 is a cross-sectional view of an integrated circuit package system in a twelfth embodiment of the present invention.

Referring now to FIG. 13, therein is shown a cross-sectional view of an integrated circuit package system 1300 in a twelfth embodiment of the present invention. The integrated circuit package system 1300 preferably includes the integrated circuit package system 400 mounted over the active side of a base die 1302, having a length or width greater than the corresponding length or width of the lower outward surface 112, using an adhesive layer 1304.

First connectors 1306 can connect the lower exposed conductors 116 near the lower inward surface 114 to the base die 1302. Second connectors 1308 can connect the upper exposed conductors 108 near and adjacent an outer side edge of the upper outward surface 104 to the base die 1302. Third connectors 1310 can connect the upper exposed conductors 108 near and adjacent an outer side edge opposite a side edge having any of the second connectors 1308 to the lower exposed conductors 116 of the lower inward surface 114.

An encapsulant 1312 can be applied over and surround the integrated circuit package system 400, the base die 1302, the first connectors 1306, the second connectors 1308, and the third connectors 1310 except for the except areas of the upper outward surface 104 not having attachment to the upper outward the second connectors 1308 or the third connectors 1310. Package connectors 1314 connect to the upper exposed conductors 108 to provide connectivity to a next level system such as another package or printed circuit board.

Figure 14:
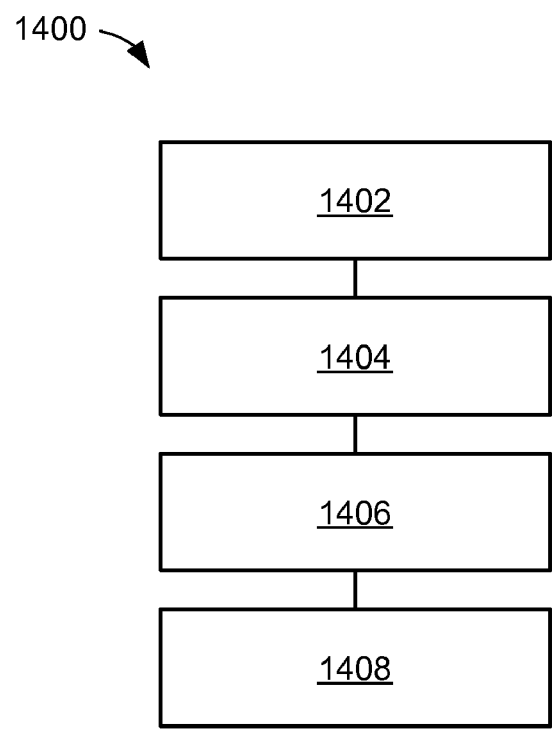
FIG. 14 therein is shown a flow chart of an integrated circuit package system for manufacturing the integrated circuit package system in an embodiment of the present invention.

Referring now to FIG. 14, therein is shown a flow chart of an integrated circuit package system 1400 for manufacturing the integrated circuit package system 100 in an embodiment of the present invention. The system 1400 includes providing a lower interposer substrate with lower exposed conductors in a block 1402; attaching a die over the lower interposer substrate in a block 1404; applying a stack encapsulant over the die and the lower interposer substrate having the lower exposed conductors partially exposed adjacent the stack encapsulant in a block 1406; and attaching an upper interposer substrate having upper exposed conductors over the stack encapsulant and with the upper exposed conductors partially exposed in a block 1408.

In greater detail, a system to provide the method and apparatus of the integrated circuit package system 100, in an embodiment of the present invention, is performed as follows:

1. Providing a lower interposer substrate with a lower inward surface and a lower outward surface having lower exposed conductors.
2. Attaching a die over the lower interposer substrate of the lower interposer substrate.
3. Applying a stack encapsulant over the die and the lower interposer substrate having the lower exposed conductors partially exposed near the lower inward surface and the lower outward surface.
4. Attaching an upper interposer substrate having an upper inward surface and an upper outward surface with upper exposed conductors over the stack encapsulant and with the upper exposed conductors substantially exposed near the upper outward surface.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a base substrate;
   attaching a base die over the base substrate;
   providing a lower interposer substrate with a lower inward surface and a lower outward surface having lower exposed conductors;
   attaching a die over the lower inward surface of the lower interposer substrate;
   applying a stack encapsulant over the die and the lower interposer substrate having the lower exposed conductors partially exposed near the lower inward surface and the lower outward surface;
   attaching an upper interposer substrate having an upper inward surface and an upper outward surface with upper exposed conductors, the upper interposer substrate having a length less than a length of the lower interposer substrate and the upper inward surface in direct contact on the stack encapsulant with the upper exposed conductors substantially exposed near the upper outward surface; and
   attaching the lower interposer substrate over the base die.

2. The method as claimed in claim 1 wherein providing the lower interposer substrate includes forming the lower interposer substrate with dimensions predetermined to provide the lower exposed conductors substantially exposed near the stack encapsulant.

3. The method as claimed in claim 1 further comprising connecting an external device to the upper outward surface of the upper interposer substrate.

4. The method as claimed in claim 1 further comprising providing a lower interposer substrate board for strip assembly.

5. An integrated circuit package system comprising:
   a base substrate:
   a base die over the base substrate;
   a lower interposer substrate with a lower inward surface and a lower outward surface having lower exposed conductors, the lower interposer substrate over the base die;
   a die over the lower inward surface of the lower interposer substrate;
   a stack encapsulant over the die and the lower interposer substrate having the lower exposed conductors partially exposed near the lower inward surface and the lower outward surface; and
   an upper interposer substrate having an upper inward surface and an upper outward surface with upper exposed conductors attached, the upper interposer substrate having a length less than a length of the lower interposer substrate and in direct contact on the stack encapsulant with the upper exposed conductors substantially exposed near the upper outward surface.

6. The system as claimed in claim 5 wherein the lower interposer substrate is formed to provide the lower exposed conductors substantially exposed near the stack encapsulant.

7. The system as claimed in claim 5 further comprising an interposer connector connected to the lower interposer substrate and the upper interposer substrate.

8. The system as claimed in claim 5 further comprising a second die attached over the lower interposer substrate.

9. The system as claimed in claim 5 further comprising package connectors over the upper exposed conductors of the upper interposer substrate.

10. The system as claimed in claim 5 wherein the lower interposer substrate includes dimensions predetermined to provide the lower exposed conductors substantially exposed near the stack encapsulant.

11. The system as claimed in claim 5 further comprising an external device connected to the upper outward surface of the upper interposer substrate.

12. The system as claimed in claim 5 further comprising a lower interposer substrate board for strip assembly.

* * * * *

UNITED STATES PATENT AND TRADEMARK OFFICE
CERTIFICATE OF CORRECTION

| | | |
|---|---|---|
| PATENT NO. | : 7,919,871 B2 | Page 1 of 1 |
| APPLICATION NO. | : 12/052910 | |
| DATED | : April 5, 2011 | |
| INVENTOR(S) | : Moon et al. | |

It is certified that error appears in the above-identified patent and that said Letters Patent is hereby corrected as shown below:

Column 12:
line 52, claim 5, delete "substrate:" and insert therefor --substrate;--

Signed and Sealed this
Fourteenth Day of June, 2011

David J. Kappos
*Director of the United States Patent and Trademark Office*